US008952309B2

United States Patent
Chen et al.

(10) Patent No.: US 8,952,309 B2
(45) Date of Patent: Feb. 10, 2015

(54) IMAGE SENSOR WITH MICRO-LENS COATING

(75) Inventors: Gang Chen, San Jose, CA (US); Hsin-Chih Tai, San Jose, CA (US); Duli Mao, Sunnyvale, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 612 days.

(21) Appl. No.: 13/252,883

(22) Filed: Oct. 4, 2011

(65) Prior Publication Data

US 2013/0082163 A1   Apr. 4, 2013

(51) Int. Cl.
*H01L 27/148* (2006.01)
*H01L 27/146* (2006.01)

(52) U.S. Cl.
CPC .... *H01L 27/14627* (2013.01); *H01L 27/14685* (2013.01)
USPC ...................................................... 250/208.1

(58) Field of Classification Search
USPC ............................ 250/208.1; 257/432; 438/70
See application file for complete search history.

(56) References Cited

U.S. PATENT DOCUMENTS

| | | | |
|---|---|---|---|
| 5,152,834 | A | 10/1992 | Allman |
| 6,157,017 | A | 12/2000 | Kim |
| 6,818,934 | B1 | 11/2004 | Yamamoto |
| 2006/0023313 | A1 | 2/2006 | Kim |
| 2009/0230394 | A1 | 9/2009 | Nagaraja et al. |
| 2012/0086093 | A1* | 4/2012 | Otsuka et al. ............... 257/432 |

OTHER PUBLICATIONS

Honeywell International, "ACCRUGLASS "T-12B"(312B, 412B, 512B) Spin-on-Glass",Material Safety Data Sheet, MSDS No. PDIF00415, Current Issue Date: Apr. 3, 2002, Revision: A,, (Apr. 3, 2002), pp. 1-7.
Pan, et al., "Spin-on-glass thin films prepared from a novel polysilsesquioxane by thermal and ultraviolet-irradiation methods", Elsevier, Thin Solid Films 345 (1999) 244-254, thin solid films, 1999 Elsevier Science S.A. PII: S0040-6090(98)01740-4, (1999), 244-254.
Toan, Nguyen N., "Spin-on Glass Materials and Applications in Advanced IC Technologies", ISBN: 90-365-12697, Nguyen Nhu Toan, 1999, (Feb. 1999), Whole Document.
Christiansen, T. et al.; Standard Operating Procedure: Spin-on-Glass, Surface Level Characterization; University of Washington, Department of Electrical Engineering, Final Project, Course: EE 527, Lecturer: Bohringer, K.; Jun. 2000; 7 pages. Retrieved from: http://www.ee.washington.edu/research/microtech/cam/SOP/PDFfiles/Spin-on%20glass%20SOP.pdf.

\* cited by examiner

*Primary Examiner* — Seung C Sohn
(74) *Attorney, Agent, or Firm* — Blakely Sokoloff Taylor & Zafman LLP

(57) ABSTRACT

Techniques and architectures for providing a coating for one or more micro-lenses of a pixel array. In an embodiment, a pixel element includes a micro-lens and a coating portion extending over a surface of the micro-lens, where a profile of the coating portion is super-conformal to, or at least conformal to, a profile of the micro-lens. In another embodiment, the coating portion is formed at least in part by orienting the surface of the micro-lens to face generally downward with the direction of gravity, the orienting to allow a fluid coating material to flow for formation of the coating portion.

9 Claims, 8 Drawing Sheets

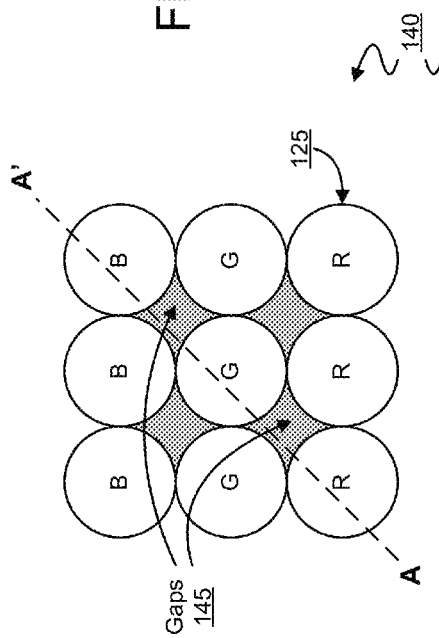
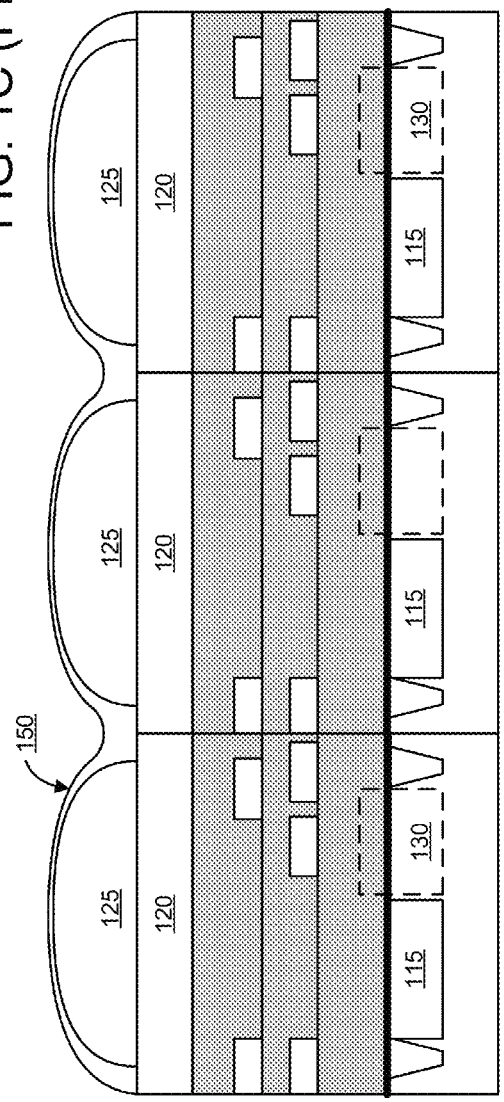

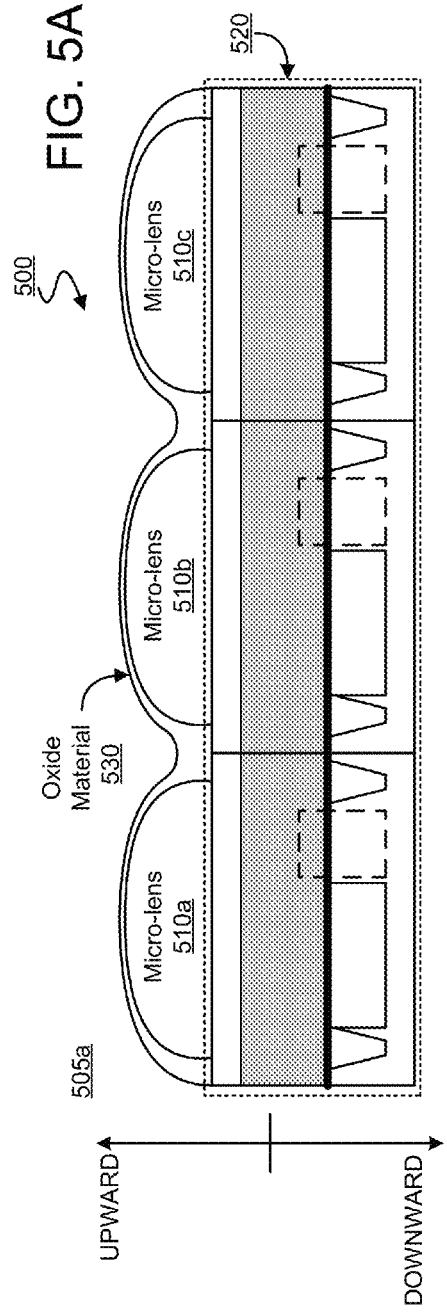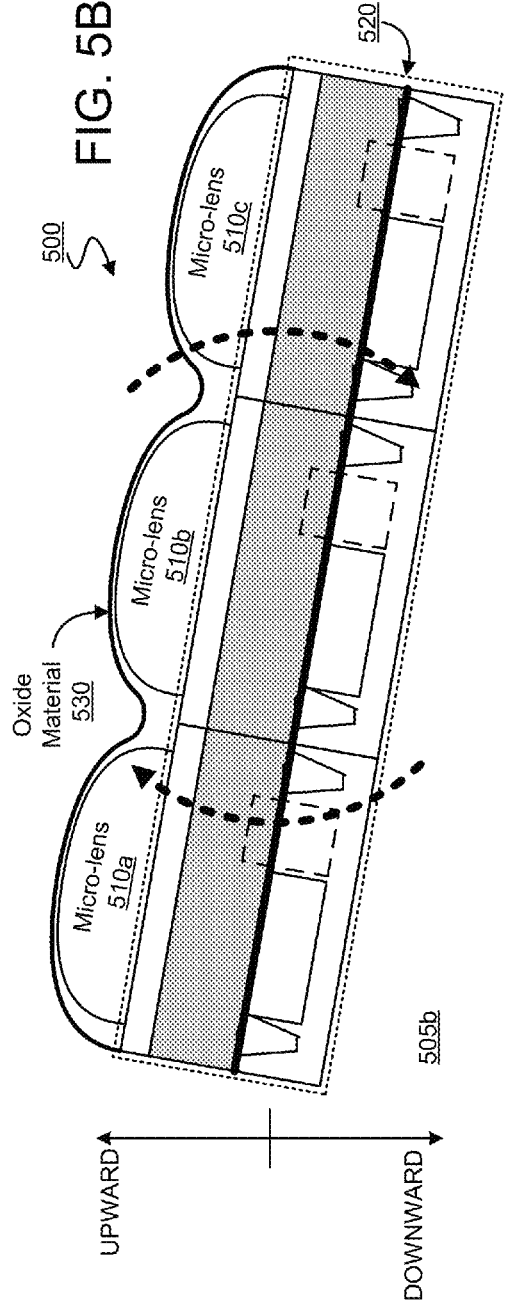

US 8,952,309 B2

IMAGE SENSOR WITH MICRO-LENS COATING

BACKGROUND

1. Technical Field

This disclosure relates generally to image sensors, and more particularly but not exclusively, relates to complementary metal-oxide-semiconductor ("CMOS") image sensors.

2. Background Art

Image sensors have become ubiquitous. They are widely used in digital still cameras, cellular phones, security cameras, as well as, medical, automobile, and other applications. The technology used to manufacture image sensors, for example, CMOS image sensors ("CIS"), has continued to advance at a great pace. For example, the demands of higher resolution and lower power consumption have encouraged the further miniaturization and integration of these image sensors.

FIG. 1A illustrates a conventional front side illuminated CIS 100. The front side of CIS 100 is the side of a substrate 105 of a semiconductor material upon which pixel components are disposed and over which a metal stack 110 for redistributing signals is formed. Metal layers (e.g., metal layer M1 and M2) of metal stack 110 are patterned in such a manner as to create an optical passage through which light incident on the front side of CIS 100 can reach a photosensitive or photodiode ("PD") region 115 in substrate 105. To implement a color CIS, the front side further includes a color filter layer 120 disposed under a micro-lens 125. Micro-lens 125 aids in focusing the light onto PD region 115.

CIS 100 includes pixel circuitry 130 disposed adjacent to PD region 115. Pixel circuitry 130 provides a variety of functionality for regular operation of CIS 100. For example, pixel circuitry 130 may include circuitry to commence acquisition of an image charge within PD region 115, to reset the image charge accumulated within PD region 115 to ready CIS 100 for the next image, or to transfer out the image data acquired by CIS 100.

FIG. 1B is a plan view of eight neighboring CIS 100 pixels within a CIS array 140. As illustrated in FIG. 1B, micro-lenses 125 of adjacent image sensors in CIS array 140 are separated by gaps 145 between the pixels—for example, where each image sensor is designed for sensing light of a particular wavelength (e.g. one of red, green, blue). Typically, conventional CIS arrays have several associated problems. For example, performance of CIS array 140 can be reduced by the reflection of incident light at the interface between the air and micro-lens 125. Gaps 145 between micro-lenses 125 can reduce fill factor, i.e. the portion of the area of CIS array which actually captures light. After formation, micro-lenses 125 can be damaged in subsequent CIS fabrication processes, such as cleaning operations. Moreover, micro-lenses 125 tend to outgas and contaminate subsequent fabrication processes, such as to the dam layer supporting the cover glass over the micro-lens array.

FIG. 1C illustrates inclusion of a conventional coating 150 to CIS array 140 to mitigate some of the above-described problems. Because of the refractive index difference between air and micro-lens 125, when light shines on image sensors, certain amount of the illumination is reflected at the surface of micro-lens 125. As it is hard to change the micro-lens material, reducing light reflection may be achieved by adding between the air and the micro-lens a coating layer 150 whose refractive index is between that of air and that of the micro-lens. To date, traditional coating application techniques have not succeeded in image sensor applications. For example, coating 150 extends non-conformally over gaps 145 between micro-lenses 125—e.g. where coating 150 fails to conform to the profile of micro-lens 125 and instead fills gaps 145 with a "U-shape" profile. Such non-conformal coating of an image sensor micro-lens tends to degrade image sensing performance.

BRIEF DESCRIPTION OF THE DRAWINGS

The various embodiments of the present invention are illustrated by way of example, and not by way of limitation, in the figures of the accompanying drawings and in which:

FIG. 1B is a plan view showing a conventional pixel element array.

FIG. 1C is a cross section schematic diagram showing a conventional pixel element array.

FIG. 5A-5C are cross section schematic diagrams showing in cross-section respective operations for forming, according to an embodiment, a micro-lens coating of a pixel array assembly.

DETAILED DESCRIPTION

Embodiments variously provide for coating some or all of a micro-lens array with a coating material—e.g. a flowable oxide such as spin-on glass (SOG) including silicon dioxide or other such material. In an embodiment, the coating has an index of refraction which is between that of air and that of a micro-lens material being coated thereby.

Certain embodiments variously include baking a flowable glass with the micro-lens array pointing in a downward orientation—i.e. with the coating material positioned beneath the micro-lenses of the array—to allow the glass to form a super-conformable coating on one or more micro-lenses.

Various embodiments are discussed herein with respect to a front side illuminated CIS. However, such discussion may be extended to apply to any of a variety of additional or alternative CIS structures—e.g. a back side illuminated CIS. Furthermore, various embodiments are discussed herein with respect to an oxide coating of a micro-lens array. However, such discussion may be extended to apply to any of a variety of additional or alternative coating materials and/or coating techniques.

Figure 2:
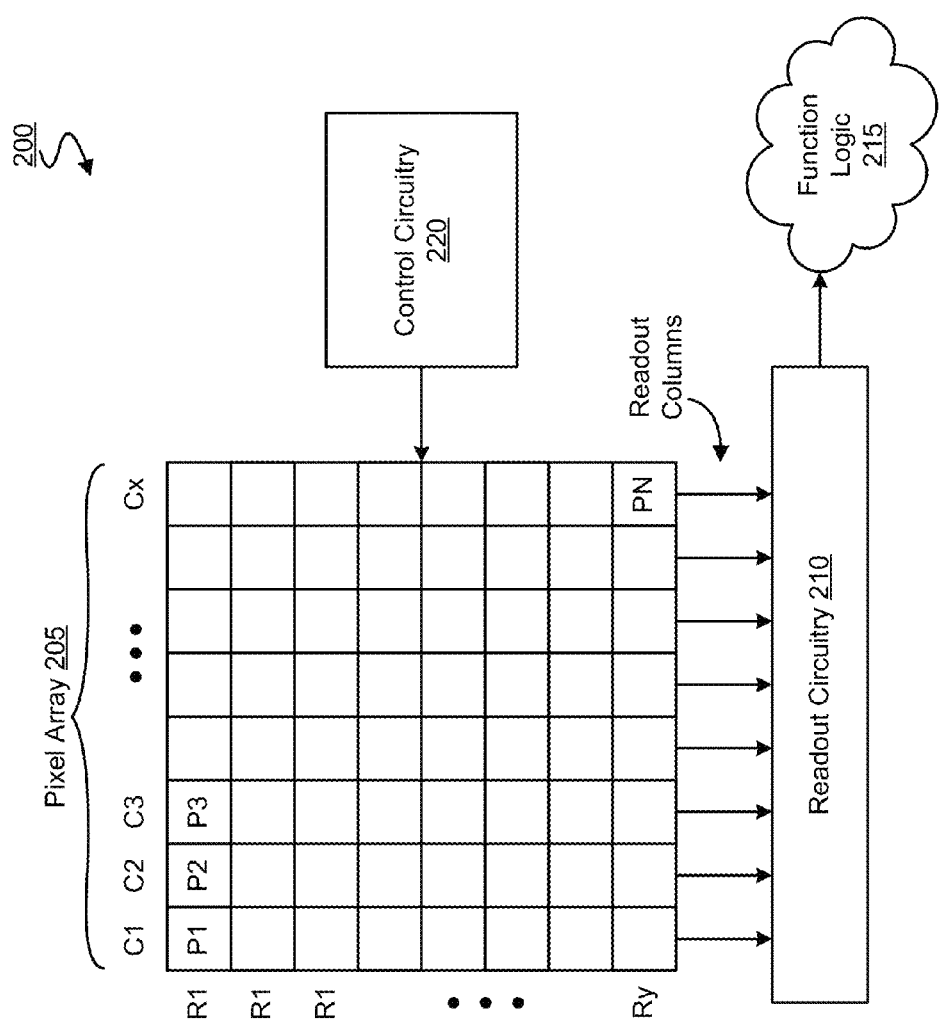
FIG. 2 is a block diagram illustrating elements of an imaging system including a super-conformal micro-lens coating, in accordance with an embodiment.

FIG. 2 is a block diagram illustrating an imaging system 200, in accordance with an embodiment of the invention. The illustrated embodiment of imaging system 200 includes a pixel array 205, readout circuitry 210, function logic 215, and control circuitry 220.

In an embodiment, pixel array 205 includes a two-dimensional ("2D") array of imaging sensors or pixels (e.g., pixel elements P1, P2 . . . , Pn). In one embodiment, each pixel is an active pixel sensor ("APS"), such as a CMOS imaging pixel. As illustrated, each pixel may be arranged into one or more rows (e.g., rows R1 to Ry) and one or more columns (e.g., column C1 to Cx) to acquire image data of a person, place, or object, which may, for example, be used to render a 2D image of the person, place, or object.

After some or all of the pixels of pixel array 205 have each acquired respective image data or image charge, the image data may be read out by readout circuitry 210 and, in an embodiment, may be transferred to function logic 215. Readout circuitry 210 may include amplification circuitry, analog-to-digital conversion circuitry and/or the like. Function logic 215 may include a processor, logic function circuitry, and/or memory. In an embodiment, function logic 215 may simply store the image data or even manipulate the image data by applying post image effects (e.g., crop, rotate, remove red eye, adjust brightness, adjust contrast, and/or the like). In one embodiment, readout circuitry 210 may read out a row of image data at a time along readout column lines (illustrated) or may readout the image data using a variety of other techniques (not illustrated), such as a serial readout or a full parallel readout of all pixels simultaneously.

Control circuitry 220 may include a controller that is coupled to pixel array 205 to control operational characteristic of pixel array 205. For example, control circuitry 220 may generate a shutter signal for controlling image acquisition. In an embodiment, a shutter signal includes a global shutter signal for simultaneously enabling all pixels within pixel array 205 to capture their respective image data during a single acquisition window. In an alternative embodiment, a shutter signal may include a rolling shutter signals whereby rows, columns, and/or other groups of pixels are sequentially enabled to capture their respective image data during consecutive acquisition windows.

Figure 3:
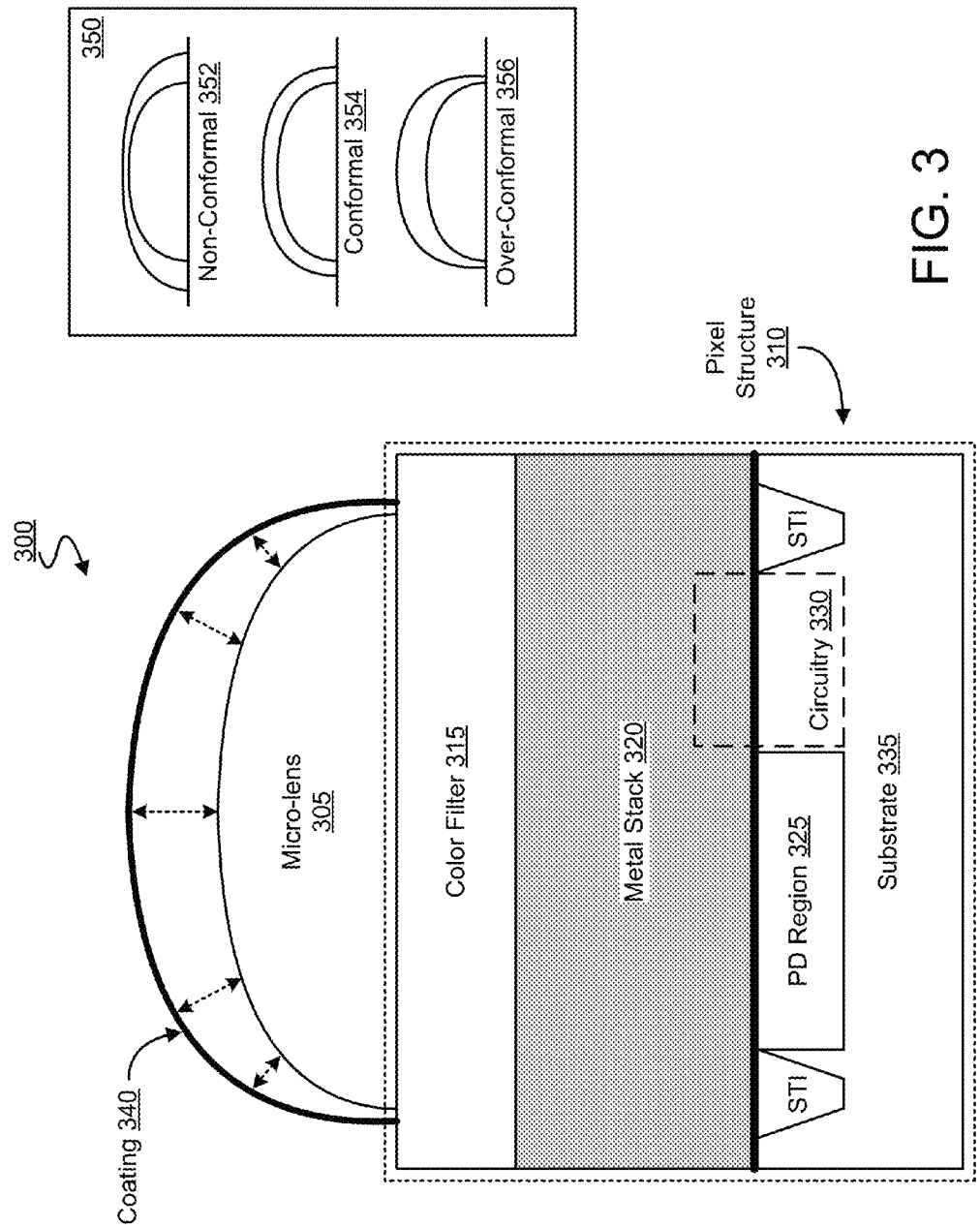
FIG. 3 is a cross section schematic diagram illustrating a cross-section of a pixel element including a micro-lens coating according to an embodiment.

FIG. 3 illustrates certain features of a pixel element 300 according to an embodiment. Pixel element 300 may, for example, be a pixel element of pixel array 205. In an embodiment, pixel element 300 includes a micro-lens 305, a pixel structure 310 adjacent to micro-lens 305 and a coating 340 covering micro-lens 305. Micro-lens 305 may, for example, comprise poly(methyl methacrylate) (PMMA) or any of a variety of other suitable transparent plastics.

Pixel structure 310 may include any of a variety of APS structures for capturing light which passes through micro-lens 305. For the purpose of illustrating features of one embodiment, pixel structure 310 is shown as including structures similar to those discussed with respect to CIS 100. More particularly, pixel structure 310 may include structures for pixel element 300 to operate as a front side illuminated image sensor.

By way of illustration and not limitation, pixel structure 310 may include a substrate 335 of semiconductor material upon which and/or in which one or more integrated circuit elements are disposed, and over which a metal stack 320 for redistributing signals is formed. Metal layers (not shown) of metal stack 320 may be patterned in such a manner as to create an optical passage through which light penetrating the pixel structure 310 may reach the photosensitive or photodiode ("PD") region 325. To implement a color CIS, pixel structure 310 may further includes a color filter layer 315 disposed under micro-lens 305. Micro-lens 305 may aid in focusing the light onto PD region 325.

Pixel structure 310 may include circuitry 330 disposed adjacent to PD region 325. In an embodiment, circuitry 330 provides a variety of functionality for regular operation of pixel structure 310. For example, circuitry 330 may include circuitry to commence acquisition of an image charge within PD region 325, to reset the image charge accumulated within PD region 325 to ready pixel structure for a next image, or to transfer out the image data acquired by pixel structure 310.

Although pixel element 300 is shown having pixel structures 310 similar to those of CIS 100, the discussion herein of a micro-lens 305 and a coating 340 of pixel element 300 may be extended to apply to a pixel element having any of a variety of alternative or additional types of pixel structures, according to various embodiments. For example, pixel structure 310 may include any of a variety of additional or alternative structures for receiving light via micro-lens 305—e.g. the structures to convert such light into electric charge and/or other image data. By way of illustration and not limitation, pixel structure 300 may include a back side illuminated pixel element, in certain embodiments. In certain embodiments, pixel structure 300 includes one or more charge-coupled device (CCD) image sensor structures.

In an embodiment, coating 340 of pixel element 300 is super-conformal (also referred to herein as a "over-conformal") with respect to micro-lens 305. As discussed below, super-conformal coating 340 is to be distinguished, for example, from a coating which is non-conformal and a coating which is merely conformal. In an embodiment, coating 340 operates as a secondary lensing material in addition to the lensing of micro-lens 305. For example, coating 340 may have a surface adjoining micro-lens 305 which has a different shape to that of the opposite, outer surface of coating 340.

Figure 1A:
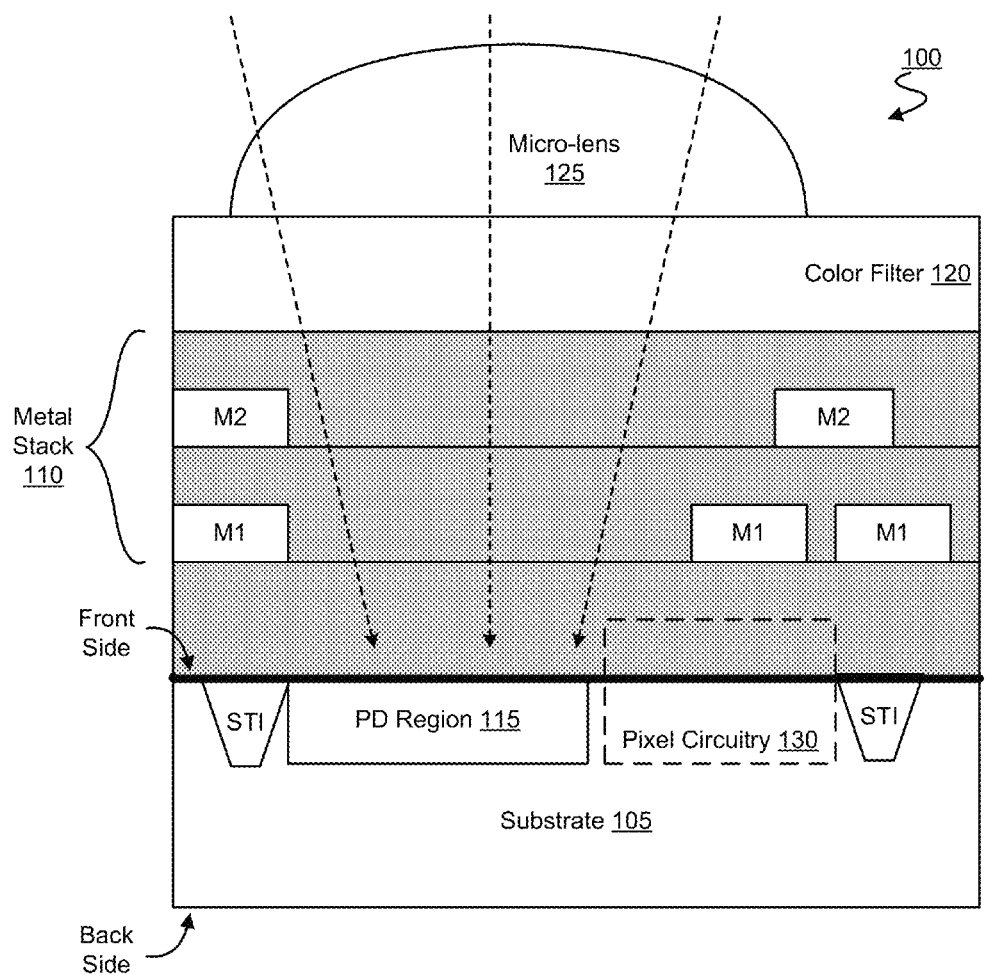
FIG. 1A is a cross section schematic diagram showing a conventional pixel element.

FIG. 3 includes an inset 350 illustrating generic examples of respective profiles for a non-conformal coating 352, a conformal coating 354 and a super-conformal 356. As can be seen in inset 350, the profile of non-conformal coating 352 does not conform to a corresponding (e.g. co-planar) profile of an underlying micro-lens at least insofar as non-conformal coating 352 has a more flattened profile. Under one interpretation, non-conformal coating 352 may alternatively be referred to as "under-conformal." The profile of non-conformal coating 352 may, for example, result from a coating process in which a coating material is, to some significant extent, not prevented from flowing away from the uppermost portion (or "crown") of the underlying micro-lens. This flow results in an accumulation of coating material along the sides of the micro-lens—for example, in a gap between the micro-lens and some other micro-lens (not shown) of an adjacent pixel element. As a result, the thickness of the resulting non-conformal coating 352—e.g. as measured in a direction normal to some given point on the surface of the underlying micro-lens—is greater for a point toward the bottom of the micro-lens than for a point at a crown of the micro-lens. As discussed in relation to FIG. 1C, conventional micro-lens coating techniques result in coatings with non-conformal profiles.

As can also be seen in inset 350, the profile of conformal coating 354 does conform to a corresponding (e.g. co-planar) profile of an underlying micro-lens. The profile of conformal coating 354 may result, for example, from a coating process in which very little, if any, coating material is allowed to flow away from the crown of the underlying micro-lens and toward the sides of the micro-lens. As a result, the conformal coating 354 is essentially of the same thickness across the surface of the micro-lens, where the conformal coating 354 has a profile which follows a profile of the underlying micro-lens. A profile such as that of conformal coating 354 may be variously achieved, for example, via coating techniques of different embodiments.

As can be further seen in inset 350, the profile of over-conformal coating 356 more than conforms to a corresponding (e.g. co-planar) profile of an underlying micro-lens. The profile of super-conformal coating 356 may represent an exaggeration, to at least some extent, of the convexity of a profile of a micro-lens covered thereby. By way of illustration and not limitation, a given micro-lens may include a hemispherical, hemi-ellipsoid, or other such curved portion, where a hyperbolic, parabolic, semi-circular, semi-elliptical or other such profile of that curved portion has a particular convexity. In exaggerating the convexity of such a profile, super-conformal coating 356 may have a thickness—e.g. as measured in a direction normal to some given point on the surface of the underlying micro-lens—which is smaller for a point toward the bottom edges of convex portion of the micro-lens than for a point at a crown of that convex portion. In the discussion of the above examples, "crown" and "uppermost" portions of a micro-lens are with respect to the orientations shown in inset 350.

Figure 4:
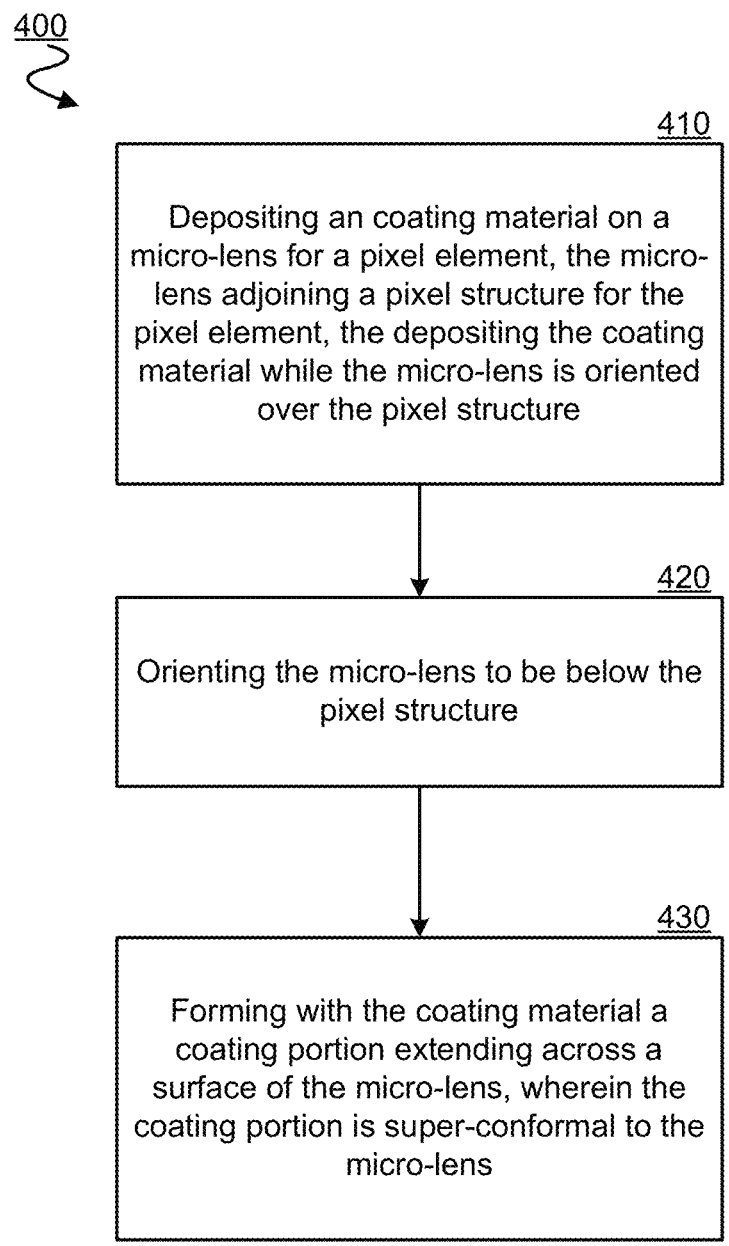
FIG. 4 is a flow diagram showing elements of a method for creating a super-conformal micro-lens coating according to an embodiment.

FIG. 4 is a flow diagram illustrating elements of a method 400 for generating, according to an embodiment, a coating including one or more portions which are each super-conformal to a respective micro-lens for a pixel array. Such a pixel array may include some or all of the features of pixel array 205, for example. By way of illustration and not limitation, method 400 may create a micro-lens coating having some or all of the features of coating 340.

Method 400 may generate and/or further process a pixel array assembly which can be considered "incomplete" at least insofar as some processing by method 400 is required to convert the pixel array assembly into a final pixel array. The pixel array assembly may, for example, include a micro-lens and an adjoining pixel structure, where the micro-lens/pixel structure pair is to form part of a pixel element of the pixel array. Such a pixel element may, for example, include some or all of the features of pixel element 300. The pixel structure may, for example, include one or more components (a photodiode, one or more transistors, etc.) which are to capture light transmitted through the adjoining micro-lens and/or to convert such light into electrical charge and/or an electrical signal. Certain embodiments are not limited with respect to the particular components within the pixel structure. In an embodiment, the pixel array assembly includes a plurality of such micro-lens/pixel structure pairs, each of which is to be part of a respective pixel element of the pixel array.

Method 400 may include, at 410, depositing a coating material on a micro-lens for the pixel element of the pixel array. The coating material may include an oxide material—e.g. a spin-on glass material comprising, for example, a solution of silicon tetrachloride and acetic anhydride, a solution of tetraethoxysilane and ethyl alcohol, and/or any of a variety of other such spin-on glass materials. Such oxide material may, for example, include one of the family of Accuglass® spin-on glass materials manufactured by Honeywell International of Santa Clara, Calif., USA, although certain embodiments are not limited in this regard. Alternatively or in addition, the coating material may include a transparent plastic—for example, PMMA—which is suitable for implementing the benefits of a micro-lens coating layer as discussed herein. In an embodiment, the coating material is deposited as a coating layer which extends to cover one or more a plurality of micro-lenses in the pixel array assembly.

Depositing the coating material at 410 may include, for example, performing a spin-coating process to apply a flowable oxide glass across a surface of contiguous pixel structures, each of which is for a respective pixel element of the pixel array. Alternatively or in addition, depositing the coating material at 410 may include performing a fog deposition and/or a spray deposition. However, certain embodiments are not limited with respect to the particular technique for initially applying the coating material onto the micro-lens.

In an embodiment, the depositing of the coating material at 410 takes place while the micro-lens for the pixel element is oriented over the corresponding pixel structure for that same pixel element. More particularly, the pixel array assembly may have an orientation during coating deposition in which a side of the micro-lens which faces away from the corresponding pixel structure is facing in a direction which is generally upward—i.e. against the direction of gravity.

Method 400 may further include, at 420, orienting the micro-lens to be below the pixel structure which is adjoining that micro-lens. For example, the pixel array assembly may be positioned to have a different orientation which is a generally inverse orientation to that which was the case during coating deposition at 410. After the orienting at 420, the pixel array assembly may have an orientation in which the side of the micro-lens which faces away from the corresponding pixel structure is facing in a direction which is generally downward—i.e. with the direction of gravity.

In certain embodiment, the pixel array assembly is subjected to a bake process after the coating deposition at 410, but before the orientating of the micro-lens at 420. Such a bake process may, for example, increase the viscosity of the deposited coating material to a sufficient extent that some or all of the more viscous coating material will remain on the pixel assembly while the pixel assembly is repositioned during the orientation at 420. In an embodiment, the coating material is only partially hardened by any such baking process prior to the orienting at 420.

By way of illustration and not limitation, the pixel array assembly may be thermally baked at a temperature between 40° C. to 80° C. for one to five minutes to allow a deposited oxide of the coating material to remain on the pixel array assembly during inversion thereof. Of course, the particular temperature and duration of such a preliminary thermal bake may vary in different embodiments—e.g. according to physical properties of oxide materials involved. In certain embodiments, a short ultra-violet (UV) bake may be used in lieu of, or in addition to, a thermal bake to retard flow of the coating material enough to allow reorientation of the pixel array assembly.

After the orientation of the micro-lens at 420, method 400 may, at 430, form a coating portion with—e.g. comprising some or all of—the deposited coating material, the coating portion extending across a surface of the micro-lens. Forming the coating portion may, for example, include maintaining the downward-facing orientation of the micro-lens to allow at least some of the deposited coating material to flow, according to its own fluidity, into a shape which is more concentrated around the micro-lens. Such a flow may draw coating material away from the sides of the micro-lens—e.g. away from a gap between two adjacent micro-lenses—and toward the crown of the micro-lens. In an embodiment, the coating material may flow to form the shape determined at least in part by its own surface tension. By way of illustration and not limitation, forming the coating portion at 430 may result in some or all of the deposited coating material forming the shape of a drop of fluid which is hanging from the micro-lens. Such a shape is referred to herein as a pendant drop shape.

In an embodiment, the formed coating portion is super-conformal to the micro-lens which is extends across. For example, the super-conformal coating portion may have a convexity which is greater than that of the coated micro-lens. A thickness of the coating portion, as measured in a direction normal to any given point on a surface of the micro-lens, may be greater at the crown of the micro-lens than it is at some other point on the surface of the micro-lens. In another embodiment, the formed coating portion is merely conformal, and yet not super-conformal, to the micro-lens which is extends across.

In an embodiment, forming the coating portion at 430 may include exposing the pixel array assembly to a vacuum or other reduction in an atmospheric pressure, the exposing to speed or otherwise increase a flow of the coating material toward the downward-facing crown of the micro-lens. Application of such a reduction in pressure may, for example, remedy a baking process which has overly-increased the viscosity of the coating material.

Forming the coating portion may, in an embodiment, include subjecting the pixel array assembly to a bake process after the coating material has flowed toward the crown of the micro-lens. Such a bake process may include baking the pixel array assembly while the micro-lens is in its orientation below the corresponding pixel structure. Alternatively or in addition, such a bake process may include baking the pixel array assembly after a re-orientation for the micro-lens to be above the corresponding pixel structure. In an embodiment, the initial bake of a coating material—e.g. in preparation for reorientation of the pixel array assembly—may be limited to a range of bake temperatures which is below a transition temperature of the material (e.g. PMMA) comprising the underlying micro-lens. Similarly, subsequent baking during or after the downward orientation of the pixel array assembly may also be limited to such a temperature range.

FIG. 5A is a cross section schematic diagram illustrating a cross-sectional view 505*a* of a pixel array assembly 500 which is to undergo processing to form a coating portion that is super-conformal, or at least conformal, to a micro-lens. Pixel array assembly 500 may, for example, undergo processing including some or all of the features of method 400. In an embodiment, processing of pixel array assembly 500 results in a pixel array having some or all of the features of pixel array 205.

Pixel array assembly 500 may include a plurality of micro-lenses, represented by the illustrative micro-lenses 510*a*, 510*b*, 510*c*. Each of micro-lenses 510*a*, 510*b*, 510*c* is to be part of a respective pixel element of the final pixel array. Pixel array assembly 500 may further include a plurality of pixel structures 520, each pixel structure adjoining a respective one of micro-lenses 510*a*, 510*b*, 510*c* to form a respective micro-lens/pixel structure pair for a respective pixel element.

For the purpose of illustrating features of certain embodiments, the plurality of pixel structures 520 are shown including pixel structures having components similar to those of pixel structure 310. However, certain embodiments are not limited by the particular pixel structures which are each to receive and convert light which is transmitted via a corresponding micro-lens. Moreover, the shapes of micro-lenses 510*a*, 510*b*, 510*c* and the relative scale of micro-lenses 510*a*, 510*b*, 510*c* to the plurality of pixel structures 520 are not limiting on certain embodiments. For example, one or more of micro-lenses 510*a*, 510*b*, 510*c* and pixel structures 520 may, in various embodiments, be conventional image sensor elements which, prior to the depositing of an oxide material 530, are formed according to conventional fabrication techniques.

In view 505*a*, oxide material 530 is deposited on micro-lenses 510*a*, 510*b*, 510*c*—e.g. according to the depositing at 410. Oxide material 530 may, for example, be deposited while pixel array assembly has a first orientation in which micro-lenses 510*a*, 510*b*, 510*c* face upward. More particularly, in view 505*a*, the pixel array assembly 500 has an orientation in which the respective sides of micro-lenses 510*a*, 510*b*, 510*c* which face away from the plurality of pixel structures 520 are facing in a direction which is generally against the direction of gravity.

After deposition, oxide material 530 may undergo an initial bake process while micro-lenses 510*a*, 510*b*, 510*c* are in an upward facing orientation. Such an initial oxide bake may, for example, be in preparation for repositioning pixel array assembly 500 for micro-lenses 510*a*, 510*b*, 510*c* to have a downward facing orientation. By way of illustration and not limitation, after oxide material 530 is spun or sprayed or otherwise deposited onto a silicon wafer which includes pixel array assembly 500, the wafer may be heated—e.g. by passing the silicon wafer over one or more plates in succession. For example, the silicon wafer may be passed over three plates, for one minute each, the plates at respective temperatures of 150° F., 200° F., and 350° F. Such baking may vary in different embodiments—e.g. according to the number of plates, the respective temperature of said plates and/or the heating periods by each plate—as suits one or more application-specific parameters. During baking, one or more hot plates may variously expel residual carrier solvent and initiate structural changes in the film of oxide material 530 to stabilize it—e.g. prior to a later furnace annealing.

FIG. 5B is a block diagram illustrating a cross-sectional view 505*b* of pixel array assembly 500 during processing which is subsequent to that shown in FIG. 5A. In view 505*b*, oxide material 530 may have an increased viscosity as compared to that during view 505*a*—e.g. due to an initial baking of oxide material 530. Such increased viscosity is illustrated in view 505*b* by the thickness of the line representing the profile of oxide material 530.

As shown in FIG. 5B, pixel array assembly 500 may be repositioned to orient micro-lenses 510*a*, 510*b*, 510*c* to be below pixel structures 520. For example, the pixel array assembly 500 may be positioned to have an orientation which is generally inverse to that which is shown in view 505*a*. After the orientation shown in view 505*b*, pixel array assembly 500 may have an orientation in which the respective sides of micro-lenses 510*a*, 510*b*, 510*c* which face away from pixel structures 520 are facing in a direction which is generally with the direction of gravity.

Figure 5C:
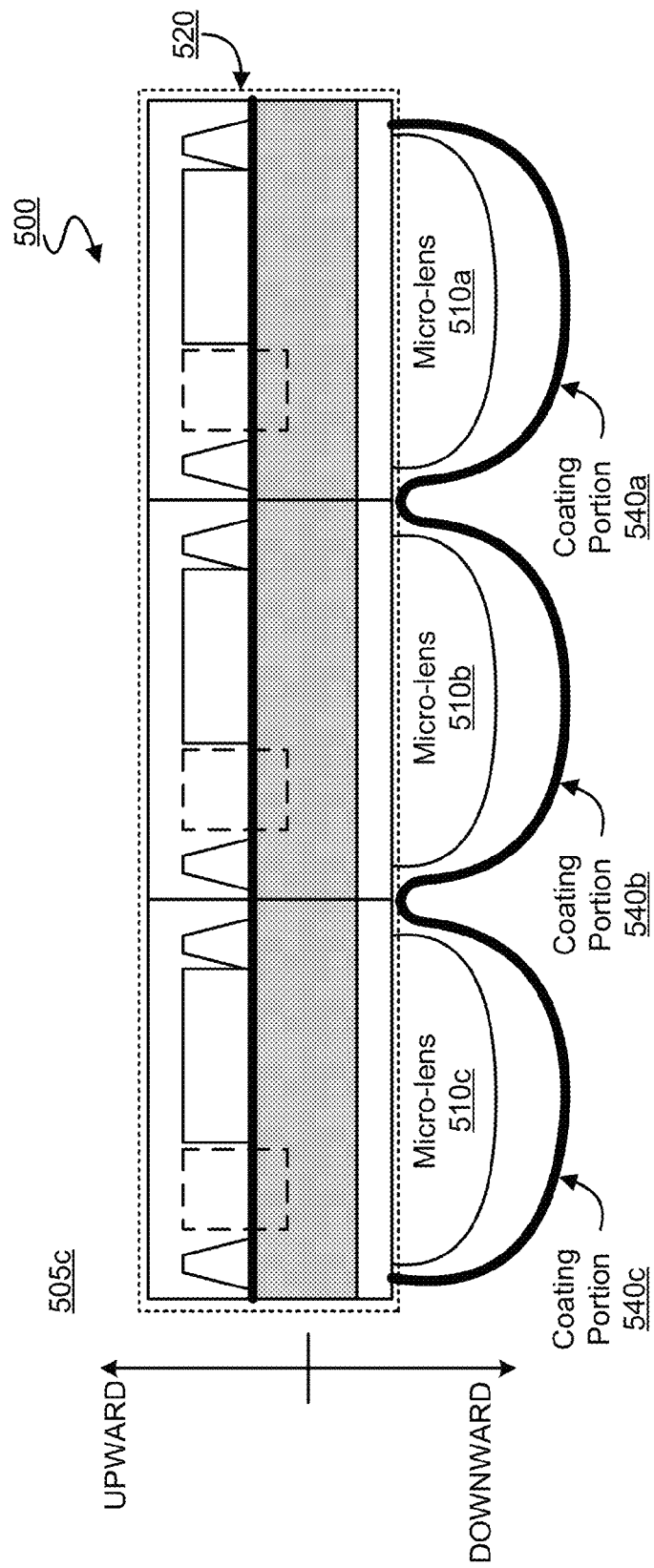

FIG. 5C is a cross section schematic diagram illustrating a cross-sectional view 505*c* of pixel array assembly 500 after the orientation processing shown in FIG. 5B. After such orienting, one or more coating portions—represented by illustrative coating portions 540*a*, 540*b*, 540*c*—may be formed with the oxide material 530. Each formed coating portion may extend across a surface of a micro-lens—e.g. across a surface of respective one of micro-lenses 510*a*, 510*b*, 510*c*.

In an embodiment, the downward-facing orientation of the micro-lenses 510*a*, 510*b*, 510*c* allows at least some of the deposited oxide material 530 to flow, according to its own fluidity, into different portions which are each concentrated around a respective micro-lens. Such a flow may draw oxide material away from the sides of the micro-lenses—e.g. away from gaps between adjacent micro-lenses—and towards the respective crowns of the micro-lenses.

As shown, the formed coating portions 540*a*, 540*b*, 540*c* are each super-conformal to the respective one of micro-lenses 510*a*, 510*b*, 510*c* which that coating portion extends across. In another embodiment, some or all of the formed one or more coating portions 540*a*, 540*b*, 540*c* are each merely conformal to—and not super-conformal to—the respective one of micro-lenses 510*a*, 510*b*, 510*c* which that coating portion extends across. Forming the coating portion may, in an embodiment, include subjecting the pixel array assembly to a bake process after the oxide material has flowed toward the crown of the micro-lens. Such a bake process may increase the viscosity of coating portions 540a, 540b, 540c—e.g. to the point of coating portions 540a, 540b, 540c being a hardened glass or other oxide material. The increased viscosity is illustrated in view 505c by the thickness of the line representing the profile of coating portions 540a, 540b, 540c.

In an embodiment, additional fabrication operations similar to those shown in FIGS. 5A-5C may be performed one or more times. For example, a successive coating layer may further be applied to pixel array assembly 500 after formation of coating portions 540a, 540b, 540c, the successive coating to apply the same oxide material 530 or, alternatively, some other material (such as PMMA) to form a coating portion having lensing and/or protective properties. Such a successive coating material may also be reoriented and baked—e.g. according to the techniques of method 400—to form one or more additional coating portions which extend across respective ones of coating portions 540a, 540b, 540c. In such an instance, a successive coating portion may extend across a surface of one of coating portions 540a, 540b, 540c, wherein a profile of that successive coating portion has a convexity which is greater than a convexity of a profile of that one of coating portions 540a, 540b, 540c.

Figure 6:
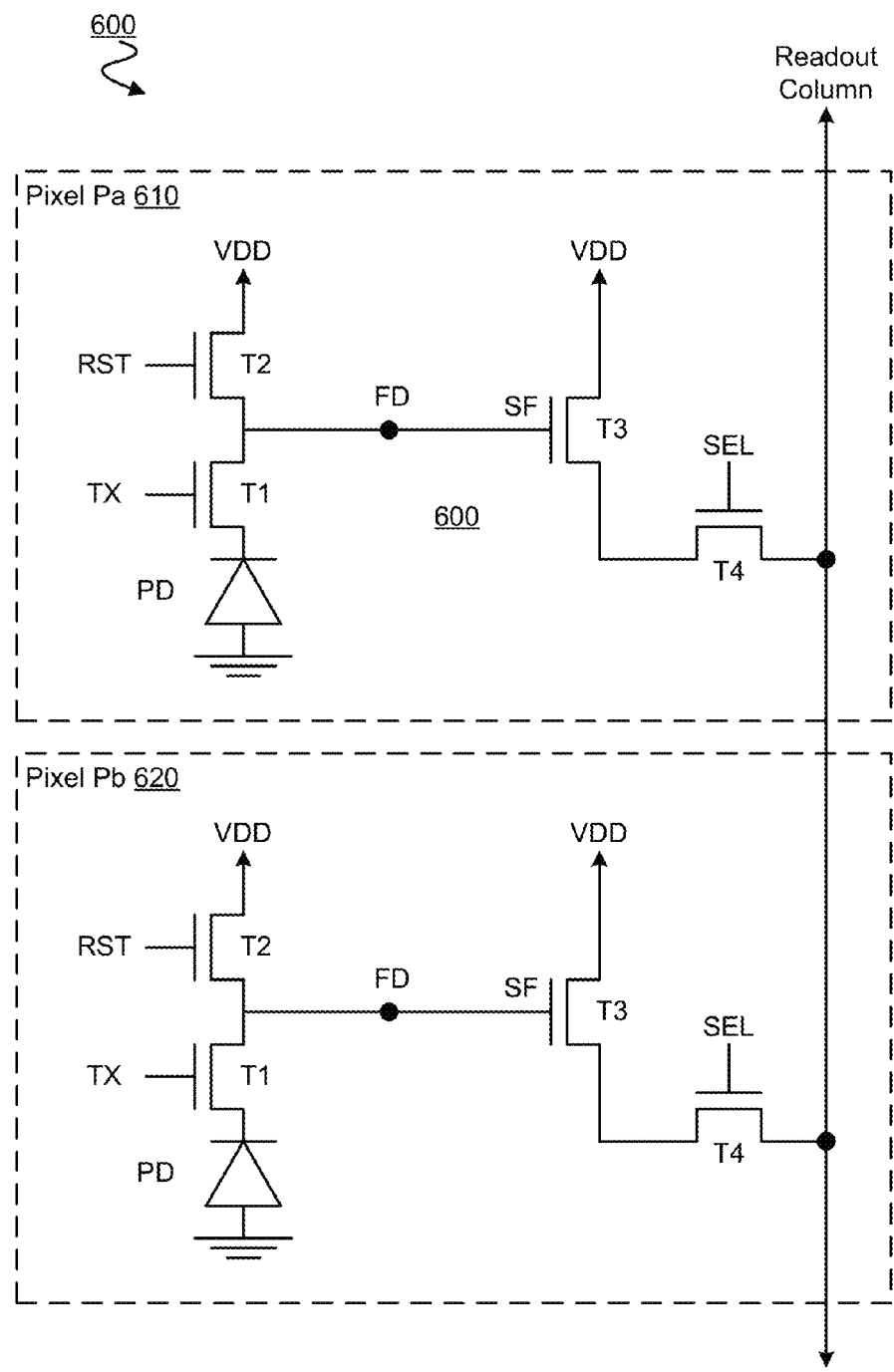
FIG. 6 is a circuit diagram illustrating pixel circuitry of two 4T pixels within an imaging system, in accordance with an embodiment of the invention.

FIG. 6 is a circuit diagram illustrating pixel circuitry 600 of two four-transistor ("4T") pixels within a pixel array, in accordance with an embodiment. Pixel circuitry 600 may include one or more pixels including some or all of the features of pixel element 300, for example. However, it should be appreciated that the embodiments described herein are not limited to 4T pixel architectures; rather, one of ordinary skill in the art having the benefit of the instant disclosure will understand that the present teachings are also applicable to 3T designs, 5T designs, and various other pixel architectures.

In FIG. 6, pixels Pa and Pb are arranged in two rows and one column. The illustrated embodiment of each pixel circuitry 600 includes a photodiode PD, a transfer transistor T1, a reset transistor T2, a source-follower ("SF") transistor T3, and a select transistor T4. During operation, transfer transistor T1 may receive a transfer signal TX which transfers a charge accumulated in photodiode PD to a floating diffusion node FD. In one embodiment, floating diffusion node FD may be coupled to a storage capacitor (not shown) for temporarily storing image charges.

Reset transistor T2 may be coupled between a power rail VDD and the floating diffusion node FD to reset the pixel (e.g., discharge or charge the FD and the PD to a preset voltage) under control of a reset signal RST. The floating diffusion node FD may be coupled to control the gate of SF transistor T3. SF transistor T3 may be coupled between the power rail VDD and select transistor T4. SF transistor T3 may operate as a source-follower providing a high impedance connection to the floating diffusion FD. Finally, select transistor T4 may selectively couple the output of pixel circuitry 600 to the readout column line under control of a select signal SEL.

In one embodiment, the TX signal, the RST signal, and the SEL signal are generated by control circuitry 220, for example. In an embodiment where image sensor array 205 operates with a global shutter, the global shutter signal may couple to the gate of each transfer transistor T1 in the entire image sensor array 205—e.g. to simultaneously commence charge transfer from each pixel's photodiode PD. Alternatively, rolling shutter signals may be applied to groups of transfer transistors T1.

Techniques and architectures for image sensing are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A method comprising:
    depositing a flowable coating material on a first micro-lens for a first pixel element of a pixel array, the first micro-lens adjoining a first pixel structure for the first pixel element, the depositing the flowable coating material while the first micro-lens is oriented over the first pixel structure;
    after the depositing the flowable coating material, orienting the first micro-lens to be below the first pixel structure;
    while the micro-lens is oriented to be below the first pixel structure, forming by flow of the flowable coating material a first coating portion extending across a surface of the first micro-lens.

2. The method of claim 1, wherein a profile of the first coating portion has a convexity which is greater than a convexity of a profile of the first micro-lens.

3. The method of claim 1, wherein a profile of the first coating portion is conformal to a profile of the first micro-lens.

4. The method of claim 1, further comprising:
    performing a first bake of the coating material prior to the orienting the first micro-lens.

5. The method of claim 1, further comprising:
    performing a second bake of the coating material after the orienting the first micro-lens, the second bake to harden the first coating portion.

6. The method of claim 1, wherein depositing the coating material includes performing a spin-on glass deposition.

7. The method of claim 1, wherein forming the first coating portion includes exposing the coating material to a reduction in an atmospheric pressure.

8. The method of claim 1, wherein profile of the first coating portion has a pendant drop shape.

9. The method of claim 1, wherein a profile of the first coating portion has a shape of a drop of fluid.

* * * * *